United States Patent
Livshitz

(10) Patent No.: US 8,583,980 B2
(45) Date of Patent: *Nov. 12, 2013

(54) LOW DENSITY PARITY CHECK (LDPC) CODE

(75) Inventor: Michael Livshitz, Rockville, MD (US)

(73) Assignee: Research In Motion Limited, Waterloo, Ontario (CA)

(*) Notice: Subject to any disclaimer, the term of this patent is extended or adjusted under 35 U.S.C. 154(b) by 0 days.

This patent is subject to a terminal disclaimer.

(21) Appl. No.: 13/619,380

(22) Filed: Sep. 14, 2012

(65) Prior Publication Data

US 2013/0013973 A1  Jan. 10, 2013

Related U.S. Application Data

(63) Continuation of application No. 13/346,155, filed on Jan. 9, 2012, now Pat. No. 8,291,289, which is a continuation of application No. 12/987,729, filed on Jan. 10, 2011, now Pat. No. 8,099,646, which is a continuation of application No. 12/796,453, filed on Jun. 8, 2010, now Pat. No. 7,917,829, which is a continuation of application No. 11/393,622, filed on Mar. 30, 2006, now Pat. No. 7,752,521, and a continuation-in-part of application No. PCT/CA2005/001563, filed on Oct. 12, 2005.

(60) Provisional application No. 60/727,932, filed on Oct. 18, 2005, provisional application No. 60/673,323, filed on Apr. 20, 2005, provisional application No. 60/656,587, filed on Feb. 25, 2005, provisional application No. 60/647,259, filed on Jan. 26, 2005, provisional application No. 60/639,420, filed on Dec. 27, 2004, provisional application No. 60/638,832, filed on Dec. 22, 2004, provisional application No. 60/635,525, filed on Dec. 13, 2004, provisional application No. 60/627,348, filed on Nov. 12, 2004, provisional application No. 60/617,902, filed on Oct. 12, 2004.

(51) Int. Cl.
*H03M 13/00* (2006.01)

(52) U.S. Cl.
USPC .......................................... 714/752; 714/758

(58) Field of Classification Search
USPC ................................................ 714/752, 758
See application file for complete search history.

(56) References Cited

U.S. PATENT DOCUMENTS 7,178,080 B2  2/2007  Hocevar
7,203,897 B2  4/2007  Blankenship et al.
(Continued)

FOREIGN PATENT DOCUMENTS

WO  2006039801  4/2006

OTHER PUBLICATIONS

Purkovic et al., "LDPC vs. Convolutional Codes for 802.11n Applications: Performance Comparison," Nortel Networks, IEEE 802.11-04/0071r1, Jan. 2004, pp. 1-12.

(Continued)

*Primary Examiner* — Sam Rizk
(74) *Attorney, Agent, or Firm* — Hanley, Flight and Zimmerman, LLC

(57) ABSTRACT

Example methods are disclosed for decoding low-density parity-check (LDPC) encoded data, involving applying an expanded parity check matrix to generate decoded data, wherein −1 represents an 81×81 all-zero square matrix, and any other integer, $S_{ij}$, represents an 81×81 identity matrix circularly right shifted by a shift amount equal to $S_{ij}$.

32 Claims, 3 Drawing Sheets

(56) References Cited

U.S. PATENT DOCUMENTS

| | | |
|---|---|---|
| 7,263,651 B2 | 8/2007 | Xia et al. |
| 7,313,752 B2 | 12/2007 | Kyung et al. |
| 7,581,157 B2 | 8/2009 | Oh et al. |
| 7,607,063 B2 | 10/2009 | Kikuchi et al. |
| 7,747,934 B2 | 6/2010 | Livshitz |
| 7,752,521 B2 | 7/2010 | Livshitz |
| 7,917,829 B2 | 3/2011 | Livshitz |
| 7,996,746 B2 | 8/2011 | Livshitz et al. |
| 8,024,641 B2 | 9/2011 | Livshitz et al. |
| 8,099,646 B2 | 1/2012 | Livshitz |
| 2001/0048744 A1 | 12/2001 | Kimura |
| 2002/0009199 A1 | 1/2002 | Ala-Laurila et al. |
| 2002/0037014 A1 | 3/2002 | Myojo et al. |
| 2002/0045428 A1 | 4/2002 | Chesson |
| 2004/0034828 A1 | 2/2004 | Hocevar |
| 2005/0050435 A1 | 3/2005 | Kyung et al. |
| 2005/0283707 A1 | 12/2005 | Sharon et al. |
| 2005/0289437 A1 | 12/2005 | Oh et al. |
| 2006/0015791 A1 | 1/2006 | Kikuchi et al. |
| 2008/0022191 A1 | 1/2008 | Stolpman et al. |
| 2011/0307755 A1 | 12/2011 | Livshitz et al. |

OTHER PUBLICATIONS

Purkovic et al., "Structured LDPC Codes as an Advanced Coding Scheme for 802.11n," IEEE 802.11-04/885r0, Sep. 2004, pp. 1-10.
Zhang et al., "VLSI Implementation-Oriented (3, k)-Regular Low Density Parity-Check Codes," IEEE, Sep. 2001, pp. 25-36.
Moschini et al., "St. Microelectronics LDPCC Proposal for 802.11N CFP," IEEE 802.11-04/0900R0, Aug. 2004, pp. 1-20.
Stephens et al., "IEEE 802.11 TGn Comparison Criteria (Phy-related 4.6 sections working document)" Intel Corp., IEEE 802.11-02/814r5, Dec. 2003, 14 pages.
Edmonston et al., "Turbo Codes for IEEE 802.11n," Icoding Technology, Inc., IEEE 802.11-04-0003-00-000n, Jan. 2004, pp. 1-20.
Simoens et al., "Towards IEEE 802.11 HDR in the Enterprise," Motorola, IEEE 802.11-02/312r0, May 2002, pp. 1-10.
Mahadevappa et al., "Different Channel Coding Options for MIMO-OFDM 802.11n," Realtek Semiconductors, Irvine, CA, IEEE 802.11-04/0014r0, Jan. 2004, pp. 1-22.
Jacobsen et al., "LDPC FEC for IEEE 802.11n Applications," Intel Labs Communications Technology Laboratory, IEEE 802.11-03/0865r0, Nov. 10, 2003, pp. 1-35.
Tzannes et al., "Extended Data Rate 802.11a," Aware, Inc., IEEE 802.11-01/232r0, Mar. 2002, pp. 1-9.
Ouyang et al., "On the Use of Reed Solomon Codes for 802.11n," Philips Research, IEEE 802.11-04/96r0, Jan. 2004, pp. 1-9.
Liang et al., "Simplifyig MAC FEC Implementation and Related Issues," Texas Instruments Incorporated, IEEE 802.11-02/0207r0, Mar. 2002, pp. 1-15.
Coffey et al., "MAC FEC Performance," Texas Instruments, IEEE 802.11-02/239r0, Mar. 2002, pp. 1-18.
Schumacher et al., "TGn Channel Models," Zyray Wireless, IEEE 802.11-03/940r4, May 2004, pp. 1-45.
Schumacher et al., "Description of a MATLAB® implementation of the Indoor MIMO WLAN channel model proposed by the IEEE 802.11 TGn Channel Model Special Committee," FUNDP—The University of Namur, Version 3.1, Jan. 2004, pp. 1-27.
Mansour et al., "High-Throughput LDPC Decoders," IEEE Trans. on VLSI Systems, vol. 11, No. 6, Dec. 2003, pp. 976-996.
Mujtaba, Syed Aon, "TGn Sync Proposal Technical Specification," IEEE 802.11-04/889r1, Nov. 2004, pp. 1-143.
Singh et al., "WWise Proposal: High throughput extension to the 802.11 Standard," Aug. 2004, Section 20.3.5.7.3, 78 pages (pp. 45-48).
Yazdani et al.,"On Construction of Rate Compatible Low-Density Parity-Check Codes," IEEE Communication Letters, vol. 8, No. 3, Mar. 2004, pp. 159-161.
Zhong et al.,"Design of VLSI Implementation-Oriented LDPC Codes," IEEE Semiannual Vehicular Technology Conference (VTC), Oct. 2003, pp. 1-4.
Chung et al., "Analysis of Sum-Product Decoding of Low-Density Parity-Check Codes Using a Gaussian Approximation," IEEE Transactions on Information Theory, vol. 47, No. 2, Feb. 2001, pp. 657-670.
Purkovic et al., "Algebraic Low-Density Parity-Check Codes for OFDMA Phy Layer," Nortel Networks, May 2004, 9 pages.
Hillman, Garth, "Minutes of High Throughput Task Group Meetings," Jan. 2004, pp. 1-19.
Gorokhov et al., "MIMO-OFDM for High Throughput WLAN: Experimental Results," Philips, Nov. 2002, IEEE 802.11-02/708r0, 23 pages.
Mahadevappa et al., "Different Channel Coding Options for MIMO-OFDM 802.11n," Realtek, Jan. 2004, IEEE 802.11-04/0014r1, 22 pages.
Gorokhov et al., "MIMO-OFDM for High Throughput WLAN: Experimental Results," Philips Research, IEEE 802.11 session Hawaii, Nov. 2002, IEEE 802.11-02/708 R1, 23 pages.
IEEE Standards Interpretations for IEEE std 802.11a-1999, Copyright 2008 by the Institute of Electrical and Electronics Engineers, Inc., Three Park Avenue, New York, New York 10016-5997 USA, pp. 1-6.
Echard et al., "The P-Rotation Low-Desity Parity Check Codes," in Proc. Globecom 2001, Nov. 2001, pp. 980-984.
Classon et al., "LDPC Coding for OFDMA Phy," Nov. 12, 2004, IEEE C802.16e-04/526r1, pp. 1-7.
Ha et al., "Puncturing for Finite Length Low-Density Parity Check Codes," ISIT 2004, Abstract, 1 page.
Tian et al., "Rate Compatible Low-Density Parity-Check Codes," ISIT 2004, Chicago, p. 153.
Ha et al., "Rate Compatible Puncturing of Length Low-Density Parity-Check Codes," IEEE Transactions on Information Theory, vol. 50, No. 11, Nov. 2004, Abstract, 1 page.
Richardson et al., "Design of Capacity-Approaching Irregular Low-Density Parity-Check Codes," IEEE Transactions on Information Theory, Feb. 2001, vol. 47, No. 2, pp. 619-637.
Hocevar, Dale E., "LDPC Code Construction With Flexible Hardware Implementation," IEEE International Conference on Communications, 2003, vol. 4, pp. 2708-2712.
United States Patent and Trademark Office, Office Action, in connection with U.S. Appl. No. 13/619,420 on Nov. 26, 2012 (5 pages).
Schumacher et al., "Description of a MATLAB® implementation of the Indoor MIMO WLAN channel model proposed by the IEEE 802.11 TGn Channel Model Special Committee," Implementation note version 3.2, May 2004 (part of USPTO records, please retrieve from U.S. Appl. No. 12/796,453).
Kou et al., "Low Density Parity Check Codes Based on Finite Geometries: A Rediscovery and New Results," Nov. 2001, IEEE transactions on information theory, vol. 47, No. 7, pp. 2711-2732.
Classon et al. "LDPC coding for OFDMA PHY." IEEE 802.16 broadband wireless access working group, Aug. 24, 2004, pp. 0-10, (part of USPTO records, please retrieve from U.S. Appl. No. 11/665,171).
Tian et al., "Construction of rate compatible LDPC codes utilizing information shortening the parity puncturing," 2005, EURASIP journal on wireless communications and networking, pp. 789-795.
Shasha, Eli, et al., "Multi-Rate LDPC code for OFDMA PHY", IEEE 802.16 Broadband Wireless Access Working Group, Jun. 26, 2004, pp. 1-7.
United States Patent and Trademark Office, Notice of Allowance, in connection with U.S. Appl. No. 11/665,171, on Apr. 1, 2011 (5 pages).
United States Patent and Trademark Office, Office Action, in connection with U.S. Appl. No. 11/665,171, on Dec. 21, 2010 (10 pages).
United States Patent and Trademark Office, Notice of Allowance, in connection with U.S. Appl. No. 11/665,171, on Sep. 7, 2010 (8 pages).
United States Patent and Trademark Office, Office Action, in connection with U.S. Appl. No. 11/665,171, on Jan. 29, 2010 (6 pages).
United States Patent and Trademark Office, Notice of Allowance, in connection with U.S. Appl. No. 12/704,850 on Apr. 29, 2011 (5 pages).
United States Patent and Trademark Office, Office Action, in connection with U.S. Appl. No. 12/704,850 on Jan. 19, 2011 (10 pages).

(56) References Cited

OTHER PUBLICATIONS

United States Patent and Trademark Office, Office Action, in connection with U.S. Appl. No. 12/704,850 on Aug. 30, 2010 (5 pages).
United States Patent and Trademark Office, Notice of Allowance, in connection with U.S. Appl. No. 13/156,942 on Apr. 11, 2012 (5 pages).
United States Patent and Trademark Office, Office Action, in connection with U.S. Appl. No. 13/156,942, on Nov. 14, 2011 (8 pages).
United States Patent and Trademark Office, Notice of Allowance, in connection with U.S. Appl. No. 11/454,824 on Feb. 17, 2010 (7 pages).
United States Patent and Trademark Office, Supplemental Notice of Allowability, in connection with U.S. Appl. No. 11/454,824 on Nov. 12, 2009 (2 pages).
United States Patent and Trademark Office, Notice of Allowance, in connection with U.S. Appl. No. 11/454,824 on Nov. 2, 2009 (4 pages).
United States Patent and Trademark Office, Office Action, in connection with U.S. Appl. No. 11/454,824 on Jun. 5, 2009 (8 pages).
United States Patent and Trademark Office, Notice of Allowance, in connection with U.S. Appl. No. 12/987,729 on Sep. 13, 2011 (8 pages).
United States Patent and Trademark Office, Office Action, in connection with U.S. Appl. No. 12/987,729 on Mar. 15, 2011 (10 pages).
United States Patent and Trademark Office, Notice of Allowance, in connection with U.S. Appl. No. 12/796,453 on Oct. 8, 2010 (8 pages).
United States Patent and Trademark Office, Office Action, in connection with U.S. Appl. No. 12/796,453 on Aug. 30, 2010 (5 pages).
United States Patent and Trademark Office, Notice of Allowance, in connection with U.S. Appl. No. 11/393,622 on Mar. 3, 2010 (7 pages).
United States Patent and Trademark Office, Notice of Allowance, in connection with U.S. Appl. No. 11/393,622 on Nov. 25, 2009 (4 pages).
United States Patent and Trademark Office, Office Action, in connection with U.S. Appl. No. 11/393,622 on Apr. 13, 2009 (9 pages).
Patent Cooperation Treaty, "International Search Report," issued by the International Searching Authority in connection with PCT application No. PCT/CA2005/001563, mailed Jan. 26, 2006 (4 pages).
Patent Cooperation Treaty, "Written Opinion of the International Searching Authority," issued by the International Searching Authority in connection with PCT/CA2005/001563, mailed Jan. 26, 2006 (6 pages).
Patent Cooperation Treaty, "International Preliminary Report on Patentability," issued by the International Preliminary Examiner Authority in connection with PCT application No. PCT/CA2005/001563, issued on Feb. 13, 2007 (7 pages).
United States Patent and Trademark Office, Notice of Allowance, in connection with U.S. Appl. No. 13/156,942 on Jun. 25, 2012 (5 pages).
Purkovic et al., "LDPC vs. Convolutional Codes for 802.11n Applications: Performance Comparison," IEEE.802.11-04/0071r1, Nortel Networks, Jan. 2004, 12 pages [source name: 11-04-0071-01-000n-11-04, 0071-01-000n-ldpc-vs-convolutional-codes-for-802-11n-applications-performance-comparison.ppt].
Purkovic et al., "LDPC vs. Convolutional Codes: Performance and Complexity Comparison," IEEE 802.11-04/xxxxr0, Nortel Networks, Mar. 2004, 10 pages [source name: 11-4-0337-00-000n-ldpc-vs-convolutional-codes-performance-and-complexity-comparison.ppt].
Niu et al., "LDPC versus Convolutional Codes in MIMO-OFDM over 11n channels," IEEE 802.11-04/682r0, Samsung Electronics, Jul. 2004, 15 pages. [source name: 11-04-0682-00-000n-ldpc-vs-cc-over-11n-channels.ppt].
Du et al., "LDPC for Mimo Systems," IEEE 802.11-04/0714r0, Mitsubishi Electric Research Lab, Jul. 2004, 12 pages [source name: 11-04-0714-00-000n-ldpc-coding-mimo-systems.ppt].
Purkovic et al., "Structured LDPC Codes as an Advanced Coding Scheme for 802.11n," IEEE 802.11-04/884r0, Nortel Networks, Aug. 13, 2004, 10 pages [source name: 11-04-0884-00-000n-structured-ldpc-codes-as-advanced-coding-scheme-802-11n.doc].
Purkovic et al., "Structured LDPC Codes as an Advanced Coding Scheme for 802.11n," IEEE 802.11-04/885r0, Nortel Networks, Sep. 2004, 10 pages [source name: 11-04-0885-00-000n-structured-ldpc-codes-as-advanced-coding-scheme-802-11n-presentation-slides.ppt].
Moschini et al. "ST Microelectronics, Partial Proposal for LDPCC as optional coding technique for IEEE 802.11 TGn High Troughput Standard," IEEE 802-11-04-898rl, STMicroelectronics, Aug. 13, 2004, 44 pages [source name: 11-04-0898-02-000n-stmicroldpccpartialproposalspecification.doc].
Moschini et al., "Project: IEEE P802.11 Working Group for Wireless Local Area Networks (WLANS)," IEEE 802.11-04/0900r4, STMicroelectronics, Aug. 2004, 31 pages. [source name: 11-04-0900-04-000n-stmicro-ldpcc-partial-proposal-presentation.ppt].
Stolpman et al., "Irregular structured LDPC codes with rate compatibility for TGn," IEEE 802.11-00/xxx, Nokia, Jan. 2000, 18 pages [source name: 11-04-0948-02-00n-irregular-structured-ldcp-codes-with-rate-compatibility-tgn.doc].
Stolpman et al., "Structured code design," IEEE 802.11-04/1362r0, Nokia, Nov. 4, 2004, 11 pages [source name: 11-04-1362-00-000n-structured-ldpc-code-design.doc].
Lindskog et al., "Record and Playback PHY Abstraction for 802.11n MAC Simulations—Using Soft PER Estimates,"IEEE 802.11-04/0182 00rl, Feb. 16, 2004, 12 pages [source name: 11-04-0182-01-000n-record-and-playback-phy-abstraction-802-11n-mac-simulations-using-soft-per-estimates.ppt].
Sampath et al., "Record and Playback PHY Abstraction for 802.11n MAC Simulations," IEEE 802.11-04/0183 00r3, Mar. 15, 2004, 24 pages [source name: 11-04-0183-03-000n-record-and-playback-phy-abstraction-802-11n-mac-simulations-using-binary-per-estimates.ppt].
Adrian P. Stephens, "IEEE 802-11 TGn Comparison Criteria (Phy-related 4.6 sections working document)," IEEE 802.11-02/814r7, Intel Corporation, Jan. 12, 2003, 29 pages [source name: 11-04-0053-05-000n-phy-related-comparison-criteria-section-4-6.doc].
Coffey et al., "Joint Proposal High throughput extension to the 802.11 standard: PHY," IEEE 802.11-05/1102r4, Jan. 13, 2006, 83 pages [source name: 11-05-1102-04-000n-joint-proposal-phy-specification.doc].
Eric Jacobson, "LDPC FEC for IEEE 802.11n Applications," IEEE 802.11-03/0865rl, Intel Labs, Nov. 10, 2003 35 pages [source name: 11-03-0865-01-000n-ldpc-fec-802-11n-applications.ppt].
United States Patent and Trademark Office, Notice of Allowance, in connection with U.S. Appl. No. 13/346,155 on Feb. 16, 2012 (5 pages).
United States Patent and Trademark Office, Notice of Allowance, in connection with U.S. Appl. No. 13/346,155 on Jun. 5, 2012 (5 pages).
United States Patent and Trademark Office, Supplemental Notice of Allowability, in connection with U.S. Appl. No. 13/346,155 on Jul. 10, 2012 (2 pages).
United States Patent and Trademark Office, Supplemental Notice of Allowability, in connection with U.S. Appl. No. 13/346,155 on Sep. 18, 2012 (2 pages).
United States Patent and Trademark Office, "Final Office Action," issued in connection with U.S. Appl. No. 13/619,420, on May 17, 2013 (10 pages).

Base matrix 41

| 1 | 0 | 1 | 0 | 1 | 0 | 0 | 0 |
|---|---|---|---|---|---|---|---|
| 1 | 0 | 0 | 1 | 1 | 1 | 0 | 0 |
| 0 | 1 | 1 | 0 | 0 | 1 | 1 | 0 |
| 1 | 0 | 0 | 1 | 0 | 0 | 1 | 1 |

Expanded matrix 42 (with 43)

| 1 | 0 | 0 | 0 | 0 | 0 | 0 | 1 | 0 | 0 | 0 | 0 | 1 | 0 | 0 | 0 | 0 | 0 | 0 | 0 | 0 | 0 | 0 | 0 |
|---|---|---|---|---|---|---|---|---|---|---|---|---|---|---|---|---|---|---|---|---|---|---|---|
| 0 | 1 | 0 | 0 | 0 | 0 | 0 | 0 | 1 | 0 | 0 | 0 | 0 | 1 | 0 | 0 | 0 | 0 | 0 | 0 | 0 | 0 | 0 | 0 |
| 0 | 0 | 1 | 0 | 0 | 0 | 1 | 0 | 0 | 0 | 0 | 0 | 0 | 0 | 1 | 0 | 0 | 0 | 0 | 0 | 0 | 0 | 0 | 0 |
| 0 | 1 | 0 | 0 | 0 | 0 | 0 | 0 | 0 | 1 | 0 | 0 | 1 | 0 | 0 | 1 | 0 | 0 | 0 | 0 | 0 | 0 | 0 | 0 |
| 0 | 0 | 1 | 0 | 0 | 0 | 0 | 0 | 0 | 0 | 1 | 0 | 0 | 1 | 0 | 0 | 1 | 0 | 0 | 0 | 0 | 0 | 0 | 0 |
| 1 | 0 | 0 | 0 | 0 | 0 | 0 | 0 | 0 | 0 | 0 | 1 | 0 | 0 | 1 | 0 | 0 | 1 | 0 | 0 | 0 | 0 | 0 | 0 |
| 0 | 0 | 0 | 1 | 0 | 0 | 0 | 1 | 0 | 0 | 0 | 0 | 0 | 0 | 0 | 1 | 0 | 0 | 1 | 0 | 0 | 0 | 0 | 0 |
| 0 | 0 | 0 | 0 | 1 | 0 | 0 | 0 | 1 | 0 | 0 | 0 | 0 | 0 | 0 | 0 | 1 | 0 | 0 | 1 | 0 | 0 | 0 | 0 |
| 0 | 0 | 0 | 0 | 0 | 1 | 1 | 0 | 0 | 0 | 0 | 0 | 0 | 0 | 0 | 0 | 0 | 1 | 0 | 0 | 1 | 0 | 0 | 0 |
| 0 | 0 | 1 | 0 | 0 | 0 | 0 | 0 | 0 | 0 | 0 | 1 | 0 | 0 | 0 | 0 | 0 | 0 | 1 | 0 | 0 | 1 | 0 | 0 |
| 1 | 0 | 0 | 0 | 0 | 0 | 0 | 0 | 0 | 1 | 0 | 0 | 0 | 0 | 0 | 0 | 0 | 0 | 0 | 1 | 0 | 0 | 1 | 0 |
| 0 | 1 | 0 | 0 | 0 | 0 | 0 | 0 | 0 | 0 | 1 | 0 | 0 | 0 | 0 | 0 | 0 | 0 | 0 | 0 | 1 | 0 | 0 | 1 |

FIG. 5

Base matrix 51

| 1 | 0 | 1 | 0 | 1 | 1 | 0 | 0 |
|---|---|---|---|---|---|---|---|
| 1 | 0 | 0 | 1 | 1 | 1 | 1 | 0 |
| 0 | 1 | 1 | 0 | 0 | 0 | 1 | 1 |
| 1 | 0 | 0 | 1 | 1 | 0 | 0 | 1 |

Expanded matrix 52

| 1 | 0 | 0 | 0 | 0 | 0 | 0 | 1 | 0 | 0 | 0 | 0 | 1 | 0 | 0 | 1 | 0 | 0 | 0 | 0 | 0 | 0 | 0 | 0 |
|---|---|---|---|---|---|---|---|---|---|---|---|---|---|---|---|---|---|---|---|---|---|---|---|
| 0 | 1 | 0 | 0 | 0 | 0 | 0 | 0 | 1 | 0 | 0 | 0 | 0 | 1 | 0 | 0 | 1 | 0 | 0 | 0 | 0 | 0 | 0 | 0 |
| 0 | 0 | 1 | 0 | 0 | 0 | 1 | 0 | 0 | 0 | 0 | 0 | 0 | 0 | 1 | 0 | 0 | 1 | 0 | 0 | 0 | 0 | 0 | 0 |
| 0 | 1 | 0 | 0 | 0 | 0 | 0 | 0 | 0 | 1 | 0 | 0 | 1 | 0 | 0 | 1 | 0 | 0 | 1 | 0 | 0 | 0 | 0 | 0 |
| 0 | 0 | 1 | 0 | 0 | 0 | 0 | 0 | 0 | 0 | 1 | 0 | 0 | 1 | 0 | 0 | 1 | 0 | 0 | 1 | 0 | 0 | 0 | 0 |
| 1 | 0 | 0 | 0 | 0 | 0 | 0 | 0 | 0 | 0 | 0 | 1 | 0 | 0 | 1 | 0 | 0 | 1 | 0 | 0 | 1 | 0 | 0 | 0 |
| 0 | 0 | 0 | 1 | 0 | 0 | 0 | 1 | 0 | 0 | 0 | 0 | 0 | 0 | 0 | 1 | 0 | 0 | 1 | 0 | 0 | 1 | 0 | 0 |
| 0 | 0 | 0 | 0 | 1 | 0 | 0 | 0 | 1 | 0 | 0 | 0 | 0 | 0 | 0 | 0 | 1 | 0 | 0 | 1 | 0 | 0 | 1 | 0 |
| 0 | 0 | 0 | 0 | 0 | 1 | 1 | 0 | 0 | 0 | 0 | 0 | 0 | 0 | 0 | 0 | 0 | 1 | 0 | 0 | 1 | 0 | 0 | 1 |
| 0 | 0 | 1 | 0 | 0 | 0 | 0 | 0 | 0 | 0 | 0 | 1 | 1 | 0 | 0 | 0 | 0 | 0 | 0 | 0 | 0 | 1 | 0 | 0 |
| 1 | 0 | 0 | 0 | 0 | 0 | 0 | 0 | 0 | 1 | 0 | 0 | 0 | 1 | 0 | 0 | 0 | 0 | 0 | 0 | 0 | 0 | 1 | 0 |
| 0 | 1 | 0 | 0 | 0 | 0 | 0 | 0 | 0 | 0 | 1 | 0 | 0 | 0 | 1 | 0 | 0 | 0 | 0 | 0 | 0 | 0 | 0 | 1 |

FIG. 6

LOW DENSITY PARITY CHECK (LDPC) CODE

RELATED APPLICATIONS

This is a continuation of U.S. patent application Ser. No. 13/346,155, filed on Jan. 9, 2012, which is a continuation of U.S. patent application Ser. No. 12/987,729, filed Jan. 10, 2011, now U.S. Pat. No. 8,099,646, which is a continuation of U.S. patent application Ser. No. 12/796,453, filed Jun. 8, 2010, now U.S. Pat. No. 7,917,829, which is a continuation of U.S. patent application Ser. No. 11/393,622, filed Mar. 30, 2006, now U.S. Pat. No. 7,752,521, which claims the benefit of U.S. Provisional Patent Application Ser. No. 60/727,932 filed on Oct. 18, 2005, and which is a continuation-in-part of International Application PCT/CA2005/001563, with an international filing date of Oct. 12, 2005, which claims the benefits of U.S. Provisional Application Nos. 60/673,323, filed Apr. 20, 2005; 60/656,587, filed Feb. 25, 2005; 60/647,259, filed Jan. 26, 2005; 60/639,420, filed Dec. 27, 2004; 60/638,832, filed Dec. 22, 2004; 60/635,525, filed Dec. 13, 2004; 60/627,348, filed Nov. 12, 2004; and 60/617,902, filed Oct. 12, 2004.

FIELD OF THE DISCLOSURE

The present disclosure generally pertains to forward error correction. In particular, the present disclosure relates to Low Density Parity Check (LDPC) codes.

BACKGROUND

In a typical communication system, forward error correction (FEC) is often applied in order to improve robustness of the system against a wide range of impairments of the communication channel.

Referring to FIG. 1, in which a typical communication network channel is depicted having an information source 101, sending data to a source coder 102 that in turn forwards the data to a channel encoder 103. The encoded data is then sent to modulator 104 onto a carrier before being transmitted over a channel 105. After transmission, a like series of operations takes place at the receiver using a demodulator 106, channel decoder 107 and source decoder 108 to produce data suitable for the information sink 109. FEC is applied by encoding the information data stream at the transmit side at the encoder 103, and performing the inverse decoding operation on the receive side at the decoder 107. Encoding usually involves generation of redundant (parity) bits that allow more reliable reconstruction of the information bits at the receiver.

In many modern communication systems, FEC uses Low Density Parity Check (LDPC) codes that are applied to a block of information data of the finite length.

One way to represent LDPC codes is by using so-called Tanner graphs, in which N symbol nodes, correspond to bits of the codeword and M check nodes, correspond to the set of parity check constraints which define the code. Edges in the graph connect symbol nodes to check nodes.

LDPC codes can also be specified by a parity check matrix H of size M×N. In the matrix H, each column corresponds to one of the symbol nodes while each row corresponds to one of the check nodes. This matrix defines an LDPC block code (N, K), where K is the information block size, N is the length of the codeword, and M is the number of parity check bits. M=N−K. A general characteristic of the LDPC parity check matrix is the low density of non-zero elements that allows utilization of efficient decoding algorithms. The structure of the LDPC code parity check matrix is first outlined in the context of prior art hardware architectures that can exploit the properties of these parity check matrices.

In order to accommodate various larger code rates without redesigning parity check matrix and therefore avoiding changing significantly base hardware wiring, expansion of a base parity check matrix is one of the common approaches. This may be achieved, for example, by replacing each non-zero element by a permutation matrix of the size of the expansion factor.

One problem often faced by the designer of LDPC codes is that the parity part of the base parity check matrix does not allow simple encoding algorithm. Another problem is that row weight is not uniform or not close to uniform.

Therefore, there is an unmet need for LDPC codes for use in modern communication systems.

SUMMARY

In accordance with a first aspect of the present disclosure there is provided a method for constructing a low-density parity-check (LDPC) code having a structured parity check matrix, the method comprises the steps of: a) constructing a base parity check matrix $H=[H_d|H_p]$, $H_d$ is a data portion of the base parity check matrix, and $H_p$ is the parity portion of the base parity check matrix; and b) expanding the base parity check matrix into an expanded parity check matrix by replacing each non-zero element by a shifted identity matrix; and replacing each zero element of the plurality of elements by a zero matrix. The base parity check matrix has a coding rate of R=1/2, 2/3, 3/4, 5/6, or 7/8; and accordingly is of the size of 12×24, 8×24, 6×24, 4×24, or 3×24.

Preferably, the parity portion allows a recursive encoding algorithm.

Preferably, the inverse of the parity portion of the expanded parity check matrix is sparse, allowing simple encoding per equation $$p = H_{p\_exp}^{-1} H_{d\_exp} d$$

wherein d is a vector of uncoded bits, p is a vector of parity bits, $H_{p\_exp}^{-1}$ is the inverse of the parity portion $H_p$ of the expanded parity check matrix, and $H_{d\_exp}$ is the data portion $H_a$ the expanded parity check matrix.

More preferably, the data portion of the base parity check matrix has a minimum column weight of 3; a coding rate of R=2/3, and has the size 8×24 and the total weight of the base parity check matrix is equal or less then 88.

More preferably, the base parity check matrix is:

```
1 1 1 1 0 0 0 0 0 0 1 0 1 1 1 1 0 0 0 0 0 0
1 1 1 1 0 0 0 1 1 1 1 0 1 0 0 0 0 1 1 0 0 0 0 0
1 1 1 1 1 1 1 0 0 0 1 0 0 0 1 0 0 0 1 1 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 1 1 0
1 1 1 1 1 1 0 1 0 0 0 1 0 0 0 1 0 0 0 0 0 1 1
1 1 1 1 1 0 0 1 1 1 0 0 0 0 0 1 1 0 0 0 0 0 0 1.
```

More preferably, the base parity check matrix is expanded by an expansion factor L of 27, and supports a code length of up to 648, and is represented by the expanded parity check matrix:

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
24 21 15  5  8 -1 -1 -1 -1 19 15 -1 17  3 -1 -1 -1 -1 -1  0  0 -1 -1 -1
15 18  7 25 -1  7  6 -1  8 -1 -1  4 -1 -1 -1 -1  0 -1 -1 -1  0  0 -1 -1
 1 24 23 12 23 -1  1 -1 -1 -1 -1 -1  0  0 12 -1 -1 -1 -1 -1 -1  0  0 -1
13  4 12 17 22 23 -1  4 -1 -1 -1  6 -1 -1 -1  9 -1 -1 -1 -1 -1 -1  0  0
14 25 26  3  5 -1 -1  8  2  7 -1 -1 -1 -1 -1  7  1 -1 -1 -1 -1 -1 -1  0
``` wherein −1 represents L×L all-zero square matrix, and other integers represent L×L identity matrix, circularly right shifted a number of times corresponding to the integers.

Preferably, the base parity check matrix has a coding rate of R=3/4, and is:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 0 0 0 0 0 0 0 1 1
0 1 1 1 1 0 0 0 1 1 1 1 1 1 0 0 1 1 1 0 0 0 0 1.
```

More preferably, the base parity check matrix is expanded by expansion factors L between 24 and $L_{max}$=96, and is represented by the expanded parity check matrix:

```
 6 38  3 93 -1 -1 -1 30 70 -1 86 -1 37 38  4 11 -1 46 48  0 -1 -1 -1 -
62 94 19 84 -1 92 78 -1 15 -1 -1 92 -1 45 24 32 30 -1 -1  0  0 -1 -1 -
71 -1 55 -1 12 66 45 79 -1 78 -1 -1 10 -1 22 55 70 82 -1 -1  0  0 -1 -
38 61 -1 66  9 73 47 64 -1 39 61 43 -1 -1 -1 -1 95 32  0 -1 -1  0  0 -
-1 -1 -1 -1 32 52 55 80 95 22  6 51 24 90 44 20 -1 -1 -1 -1 -1 -1  0  (
-1 63 31 88 20 -1 -1 -1  6 40 56 16 71 53 -1 -1 27 26 48 -1 -1 -1 -1  (
``` wherein −1 represents L×L all-zero square matrix, the integer $s_{ij}$ represents circular shifted L×L identity matrix, the amount of the shift $s_{ij}$ is determined as follows:

$$s'_{ij} = \begin{cases} \text{floor}\left(\frac{L \times s_{ij}}{L_{max}}\right), & s_{ij} > 0 \\ s_{ij}, & \text{otherwise.} \end{cases}$$

In accordance with another aspect of the present disclosure there is provide a storage medium readable by a computer encoding a computer program for execution by the computer to carry out a method for constructing a low-density parity-check (LDPC) code having a structured parity check matrix, the computer program comprises: a) code means for constructing a base parity check matrix $H=[H_d|H_p]$ having a plurality of elements, $H_d$ being a data portion of the base parity check matrix, $H_p$ being the parity portion of the base parity check matrix; and b) code means for expanding the base parity check matrix into an expanded parity check matrix by replacing each non-zero element of the plurality of elements by a shifted identity matrix, and each zero element of the plurality of elements by a zero matrix. The base parity check matrix has a coding rate selected from the group consisting of R=1/2, 2/3, 3/4, 5/6, and 7/8; and accordingly is of the size selected from the group consisting of 12×24, 8×24, 6×24, 4×24, and 3×24.

Preferably, the data portion of the base parity check matrix has a minimum weight of 3, the base parity check matrix has a constraint of maximum base parity check matrix weight of 88, and the base parity check matrix is:

```
1 1 1 1 0 0 0 0 0 0 1 0 1 1 1 1 0 0 0 0 0 0
1 1 1 1 0 0 0 1 1 1 1 0 1 0 0 0 0 1 1 0 0 0 0 0
```

-continued

```
1 1 1 1 1 1 1 0 0 0 1 0 0 0 1 0 0 0 1 1 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
1 1 1 1 1 1 0 1 0 0 0 1 0 0 0 1 0 0 0 0 0 0 1 1
1 1 1 1 0 0 1 1 1 0 0 0 0 0 1 1 0 0 0 0 0 0 0 1.
```

More preferably, the base parity check matrix is expanded by an expansion factor L of 27, thereby supporting a code length of up to 648, and is represented by the expanded parity check matrix:

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
24 21 15  5  8 -1 -1 -1 -1 19 15 -1 17  3 -1 -1 -1 -1 -1  0  0 -1 -1 -1
15 18  7 25 -1  7  6 -1  8 -1 -1  4 -1 -1 -1 -1  0 -1 -1 -1  0  0 -1 -1
 1 24 23 12 23 -1  1 -1 -1 -1 -1  0  0 12 -1 -1 -1 -1 -1 -1 -1  0  0 -1
13  4 12 17 22 23 -1  4 -1 -1 -1  6 -1 -1 -1  9 -1 -1 -1 -1 -1 -1  0  0
14 25 26  3  5 -1 -1  8  2  7 -1 -1 -1 -1 -1  7  1 -1 -1 -1 -1 -1 -1  0
``` wherein −1 represents L×L all-zero square matrix, and other integers represent L×L identity matrix, circularly right shifted a number of times corresponding to the integers.

Preferably, the base parity check matrix has a coding rate of R=3/4, and is:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 0 0 0 0 0 0 0 1 1
0 1 1 1 1 0 0 0 1 1 1 1 1 1 0 0 1 1 1 0 0 0 0 1.
```

More preferably, the base parity check matrix is expanded by expansion factors L between 24 and $L_{max}$=96, and is represented by the expanded parity check matrix:

```
 6 38  3 93 -1 -1 -1 30 70 -1 86 -1 37 38  4 11 -1 46 48  0 -1 -1 -1 −
62 94 19 84 -1 92 78 -1 15 -1 -1 92 -1 45 24 32 30 -1 -1  0  0 -1 -1 −
71 -1 55 -1 12 66 45 79 -1 78 -1 -1 10 -1 22 55 70 82 -1 -1  0  0 -1 −
38 61 -1 66  9 73 47 64 -1 39 61 43 -1 -1 -1 -1 95 32  0 -1 -1  0  0 −
-1 -1 -1 -1 32 52 55 80 95 22  6 51 24 90 44 20 -1 -1 -1 -1 -1 -1  0  (
-1 63 31 88 20 -1 -1 -1  6 40 56 16 71 53 -1 -1 27 26 48 -1 -1 -1 -1  (
``` wherein −1 represents L×L all-zero square matrix, the integer $s_{ij}$ represents circular shifted L×L identity matrix, the amount of the shift $s'_{ij}$ is determined as follows:

$$s'_{ij} = \begin{cases} \text{floor}\left(\dfrac{L \times s_{ij}}{L_{max}}\right), & s_{ij} > 0 \\ s_{ij}, & \text{otherwise.} \end{cases}$$

In accordance with another aspect of the present disclosure there is provide a low density parity check (LDPC) base parity check matrix for use in communication systems, comprising a data part having a minimum weight of 3, the base parity check matrix having a coding rate of R=2/3, a constraint of maximum base parity check matrix weight of 88, the base parity check matrix being:

```
1 1 1 1 0 0 0 0 0 0 1 0 1 1 1 1 1 0 0 0 0 0 0 0
1 1 1 1 0 0 0 1 1 1 1 0 1 0 0 0 0 1 1 0 0 0 0 0
1 1 1 1 1 1 1 0 0 0 1 0 0 0 1 0 0 0 1 1 0 0 0 0
1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
```

-continued
```
1 1 1 1 1 1 0 1 0 0 0 1 0 0 0 1 0 0 0 0 0 1 1
1 1 1 1 1 0 0 1 1 1 0 0 0 0 0 1 1 0 0 0 0 0 0 1.
```

Preferably, an LDPC code is expanded from the above base parity check matrix by an expansion factor L of 27, thereby supporting a code length of up to 648, and is represented by following matrix:

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
```

-continued

| | | | | | | | | | | | | | | | | | | | | | | | |
|---|---|---|---|---|---|---|---|---|---|---|---|---|---|---|---|---|---|---|---|---|---|---|---|
| 24 | 21 | 15 | 5 | 8 | −1 | −1 | −1 | −1 | 19 | 15 | −1 | 17 | 3 | −1 | −1 | −1 | −1 | −1 | 0 | 0 | −1 | −1 | −1 |
| 15 | 18 | 7 | 25 | −1 | 7 | 6 | −1 | 8 | −1 | −1 | 4 | −1 | −1 | −1 | −1 | 0 | −1 | −1 | −1 | 0 | 0 | −1 | −1 |
| 1 | 24 | 23 | 12 | 23 | −1 | 1 | −1 | −1 | −1 | −1 | −1 | 0 | 0 | 12 | −1 | −1 | −1 | −1 | −1 | −1 | 0 | 0 | −1 |
| 13 | 4 | 12 | 17 | 22 | 23 | −1 | 4 | −1 | −1 | −1 | 6 | −1 | −1 | −1 | 9 | −1 | −1 | −1 | −1 | −1 | −1 | 0 | 0 |
| 14 | 25 | 26 | 3 | 5 | −1 | −1 | 8 | 2 | 7 | −1 | −1 | −1 | −1 | −1 | 7 | 1 | −1 | −1 | −1 | −1 | −1 | −1 | 0 | wherein −1 represents L×L all-zero square matrix, and other integers represent L×L identity matrix, circularly right shifted a number of times corresponding to the integers.

BRIEF DESCRIPTION OF THE DRAWINGS

The invention and the illustrated embodiments may be better understood, and the numerous objects, advantages, and features of the present disclosure and illustrated embodiments will become apparent to those skilled in the art by reference to the accompanying drawings, and wherein:

FIG. 5 is an example of a base parity check matrix expansion; and

FIG. 6 is an example showing an expanded matrix.

DETAILED DESCRIPTION

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Decoder Architecture

Efficient decoder architectures are enabled by designing the parity check matrix, which in turn defines the LDPC code, around some structural assumptions: structured LDPC codes.

One example of this design is that the parity check matrix comprises sub-matrices in the form of binary permutation or pseudo-permutation matrices.

The term "permutation matrices" is intended to mean square matrices with the property that each row and each column has one element equal to 1 and other elements equal to 0. The term "pseudo-permutation matrices" is intended to include matrices that are not necessarily square matrices, and matrices may have row(s) and/or column(s) consisting of all zeros. It has been shown, that using this design, significant savings in wiring, memory, and power consumption are possible while still preserving the main portion of the coding gain. This design enables various serial, parallel, and semi parallel hardware architectures and therefore various trade-off mechanisms.

Encoder Architecture

LDPC parity check matrix design also results in the reduction in encoder complexity. Classical encoding of LDPC codes is more complex than encoding of other advanced codes used in FEC, such as turbo codes. In order to ease this complexity it has become common to design systematic LDPC codes with the parity part comprising a lower triangular matrix. This allows simple recursive decoding. One simple example of a lower triangular matrix is a dual diagonal matrix as shown in FIG. 2.

Figure 1:
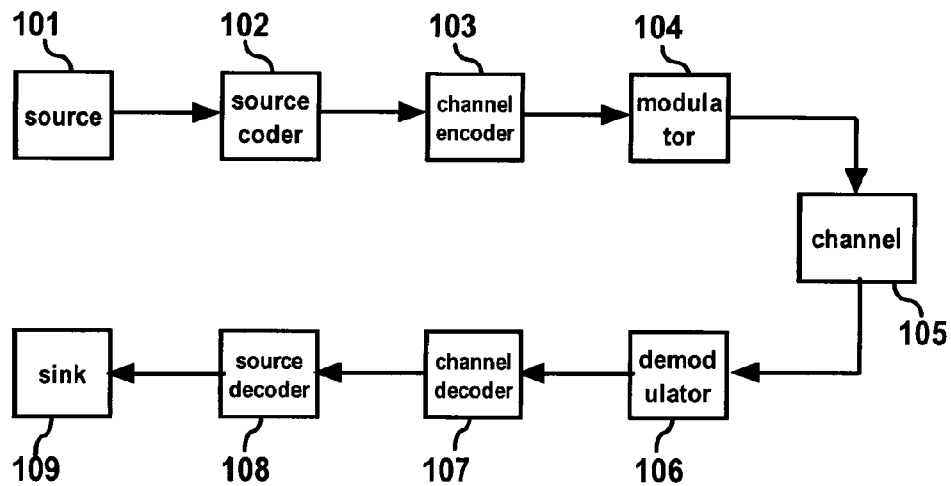
FIG. 1 shows a typical system in which embodiments of the invention may be practiced.
Figure 2:
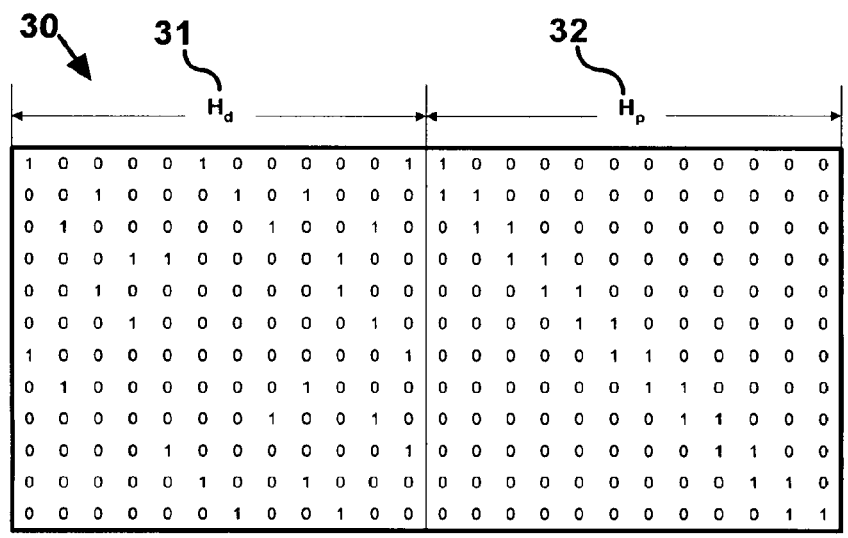
FIG. 2 depicts an example of a parity check matrix with dual diagonal.

Referring to FIG. 2, the parity check matrix 30 is partitioned as $H=[H_d|H_p]$. Data part $H_d$ 31 is an M×K matrix that corresponds to the data bits of the codeword. The design of the $H_d$ 31 matrix ensures high coding gain. Parity part $H_p$ 32 is in this example an M×M dual diagonal matrix and corresponds to the parity bits of the codeword. These codes are systematic block codes. The codeword vector for these systematic codes has the structure:

$$c = \begin{bmatrix} d \\ p \end{bmatrix}$$

where $d=[d_0 \ldots d_{K-1}]^T$ is the block of (uncoded) data bits and $p=[p_0 \ldots p_{M-1}]^T$ are the parity bits. A codeword is any binary (or in general, non-binary) N-vector c that satisfies:

$$Hc = H_d d + H_p p = 0$$

Thus, a given data block d is encoded by solving binary equation $H_d d = H_p p$ for the parity bits p. In principle, this involves inverting the M×M matrix $H_p$:

$$p = H_p^{-1} H_d d \qquad \text{[equation 1]}$$

This assumes $H_p$ is invertible. If $H_p^{-1}$ is also low density then the direct encoding specified by the above formula can be done efficiently.

Expansion of the Base Parity Check Matrix

One desirable feature of LDPC codes is that they support various required code rates and block sizes. A common approach is to have a small base parity check matrix defined for each required code rate and to support various block sizes by expanding the base matrix. Since it is usually required to support a range of block sizes, a common approach is to define expansion for the largest block size and then apply other algorithms which specify expansion for smaller block sizes. Below is an example of a base matrix:

```
11   0  10   6   3   5   1   -1  -1  -1  -1
10   9   2   2   3   0  -1   0   0  -1  -1  -1
 7   9  11  10   4   7  -1  -1   0   0  -1  -1
 9   2   4   6   5   3   0  -1  -1   0   0  -1
 3  11   2   3   2  11  -1  -1  -1  -1   0   0
 2   7   1   0  10   7   1  -1  -1  -1  -1   0
```

In this example the base parity check matrix is designed for the code rate R=½ and its dimensions are $(M_b \times N_b)=(6 \times 12)$. Assume that the block (codeword) sizes (lengths) to be supported are in the range N=[72, 144], with increments of 12, i.e. N=[72, 84, ..., 132, 144]. In order to accommodate those block lengths the parity check matrix needs to be of the appropriate size (i.e. the number of columns match N, the block length). The number of rows is defined by the code rate: M=(1−R)N. The expansion is defined by the base parity check matrix elements and the expansion factor L, which results the maximum block size. The conventions used in this example, for interpreting the numbers in the base matrix, are as follows:

−1, represents L×L all-zero square matrix, $0_L$, L equals 12 in this example;

0, represents L×L identity matrix, $I_L$.

integer, r(<L), represents L×L identity matrix, $I_L$, rotated to the right (for example) a number of times corresponding to the integer.

The following example shows a rotated identity matrix where the integer specifying rotation is 5:

```
0 0 0 0 0 1 0 0 0 0 0 0
0 0 0 0 0 0 1 0 0 0 0 0
0 0 0 0 0 0 0 1 0 0 0 0
0 0 0 0 0 0 0 0 1 0 0 0
0 0 0 0 0 0 0 0 0 1 0 0
0 0 0 0 0 0 0 0 0 0 1 0
0 0 0 0 0 0 0 0 0 0 0 1
1 0 0 0 0 0 0 0 0 0 0 0
0 1 0 0 0 0 0 0 0 0 0 0
0 0 1 0 0 0 0 0 0 0 0 0
0 0 0 1 0 0 0 0 0 0 0 0
0 0 0 0 1 0 0 0 0 0 0 0
```

Therefore, for the codeword size of N=144, base parity check matrix needs to be expanded by an expansion factor of 12. That way the final parity check matrix to be used for encoding and generating the codeword of size 144, is of the size (72×144). In other words, the base parity check matrix was expanded $L_{max}$=12 times (from 6×12 to 72×144). For block sizes smaller than the maximum, the base parity check matrix gets expanded by a factor $L < L_{max}$. In this case expansion is performed in a similar fashion except that now matrices $I_L$ and $0_L$, are used instead of $I_{Lmax}$ and $0_{Lmax}$, respectively. Integers specifying the amount of rotation of the appropriate identity matrix, $I_L$, are derived from those corresponding to the maximum expansion.

Figure 3:
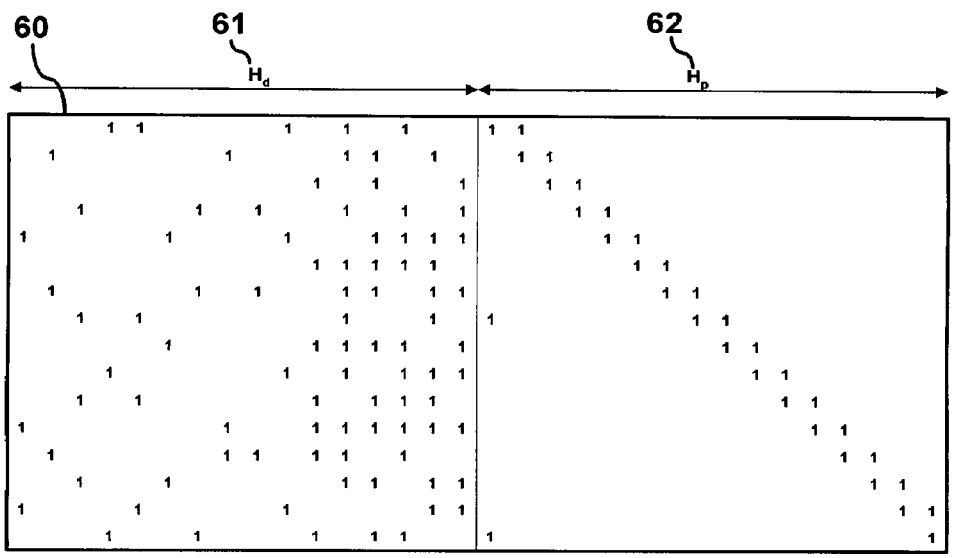
FIG. 3 illustrates an example of base parity check matrix.
Figure 4:
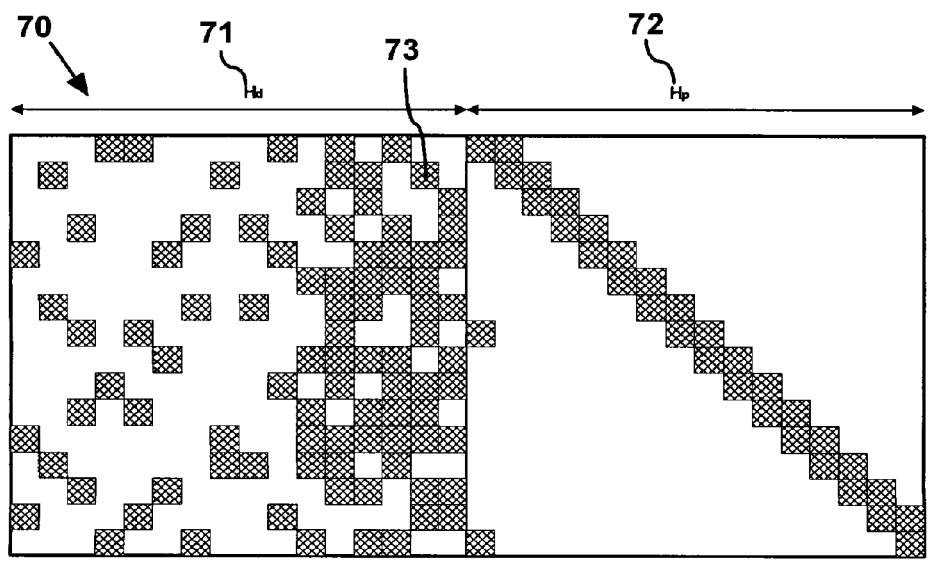
FIG. 4 shows an example of the expanded parity check matrix of FIG. 3.

An example of such a matrix is shown in FIG. 3 where the matrix 60 comprises the data part $H_d$ 61 and the parity part $H_p$ 62. The corresponding expanded matrix is shown in FIG. 4 also having a data part $H_d$ 71 and the parity part $H_p$ 72 of the matrix 70. Each of the shaded squares 73 indicates a L×L small permutation matrix that is placed on the position of the 1's in the base matrix, where L is the expansion factor. So if the size of the base parity check matrix was $M_b \times N_b$, the size of expanded matrix is now $M \times N = LM_b \times LN_b$.

The expansion may be done for example by replacing each non-zero element with a permutation matrix of the size of the expansion factor. One example of performing expansion is as follows:

Expansion of $H_p$ may be done by replacing each "0" element by an L×L zero matrix, $0_{L \times L}$, and each "1" element by an L×L identity matrix, $I_{L \times L}$, where L represents the expansion factor.

Expansion of $H_d$ may be done by replacing each "0" element by an L×L zero matrix, $0_{L \times L}$, and each "1" element by a circularly shifted version of an L×L identity matrix, $I_{L \times L}$. The shift order, s(number of circular shifts to the right, for example) is determined for each non-zero element of the base matrix.

It should be apparent to a person skilled in the art that these expansions can be implemented without the need to significantly change the base hardware wiring.

FIG. 5 shows an example of a base parity check matrix 41 and a corresponding expanded matrix 42 using 3×3 submatrices of which that labeled 43 is an example.

The simple recursive algorithm can be applied to the expanded matrix. If $h_{i,j}$ represent elements of the $H_d$ portion of the expanded parity check matrix, then parity bits can be determined as follows:

$$p_0 = h_{0,0}d_0 + h_{0,1}d_1 + h_{0,2}d_2 + \ldots + h_{0,11}d_{11}$$

$$p_1 = h_{1,0}d_0 + h_{1,1}d_1 + h_{1,2}d_2 + \ldots + h_{1,11}d_{11}$$

$$p_2 = h_{2,0}d_0 + h_{2,1}d_1 + h_{2,2}d_2 + \ldots + h_{2,11}d_{11}$$

$$p_3 = p_0 + h_{3,0}d_0 + h_{3,1}d_1 + h_{3,2}d_2 + \ldots + h_{3,11}d_{11}$$

$$p_4 = p_1 + h_{4,0}d_0 + h_{4,1}d_1 + h_{4,2}d_2 + \ldots + h_{4,11}d_{11}$$

$$p_5 = p_2 + h_{5,0}d_0 + h_{5,1}d_1 + h_{5,2}d_2 + \ldots + h_{5,11}d_{11}$$

$$p_6 = p_3 + h_{6,0}d_0 + h_{6,1}d_1 + h_{6,2}d_2 + \ldots + h_{6,11}d_{11}$$

$$p_7 = p_4 + h_{7,0}d_0 + h_{7,1}d_1 + h_{7,2}d_2 + \ldots + h_{7,11}d_{11}$$

$$p_8 = p_5 + h_{8,0}d_0 + h_{8,1}d_1 + h_{8,2}d_2 + \ldots + h_{8,11}d_{11}$$

$$p_9 = p_6 + h_{9,0}d_0 + h_{9,1}d_1 + h_{9,2}d_2 + \ldots + h_{9,11}d_{11}$$

$$p_{10} = p_7 + h_{10,0}d_0 + h_{10,1}d_1 + h_{10,2}d_2 + \ldots + h_{10,11}d_{11}$$

$$p_{11} = p_8 + h_{11,0}d_0 + h_{11,1}d_1 + h_{11,2}d_2 + \ldots + h_{11,11}d_{11}$$

However, when the expansion factor becomes large, then the number of columns with only one non-zero element, i.e. 1 in the example here, in the $H_p$ becomes large as well. This may have a negative effect on the performance of the code. One remedy for this situation is to use a slightly modified dual diagonal $H_p$ matrix. This is illustrated with reference to FIG. 6 where the modified base parity check matrix 51 produces the expanded matrix 52.

The parity check equations now become:

$$h_{0,0}d_0 + h_{0,1}d_1 + \ldots + h_{0,11}d_{11} + p_0 + p_3 = 0 \quad \text{[equation 2]}$$

$$h_{1,0}d_0 + h_{1,1}d_1 + \ldots + h_{1,11}d_{11} + p_1 + p_4 = 0 \quad \text{[equation 3]}$$

$$h_{2,0}d_0+h_{2,1}d_1+\ldots+h_{2,11}d_{11}+p_2+p_5=0 \quad \text{[equation 4]}$$

$$h_{3,0}d_0+h_{3,1}d_1+\ldots+h_{3,11}d_{11}+p_0+p_3+p_6=0 \quad \text{[equation 5]}$$

$$h_{4,0}d_0+h_{4,1}d_1+\ldots+h_{4,11}d_{11}+p_1+p_4+p_7=0 \quad \text{[equation 6]}$$

$$h_{5,0}d_0+h_{5,1}d_1+\ldots+h_{5,11}d_{11}+p_2+p_5+p_8=0 \quad \text{[equation 7]}$$

$$h_{6,0}d_0+h_{6,1}d_1+\ldots+h_{6,11}d_{11}+p_6+p_9=0 \quad \text{[equation 8]}$$

$$h_{7,0}d_0+h_{7,1}d_1+\ldots+h_{7,11}d_{11}+p_7+p_{10}=0 \quad \text{[equation 9]}$$

$$h_{8,0}d_0+h_{8,1}d_1+\ldots+h_{8,11}d_{11}+p_8+p_{11}=0 \quad \text{[equation 10]}$$

$$h_{9,0}d_0+h_{9,1}d_1+\ldots+h_{9,11}d_{11}+p_0+p_9=0 \quad \text{[equation 11]}$$

$$h_{10,0}d_0+h_{10,1}d_1+\ldots+h_{10,11}d_{11}+p_1+p_{10}=0 \quad \text{[equation 12]}$$

$$h_{11,0}d_0+h_{11,1}d_1+\ldots+h_{11,11}d_{11}+p_2+p_{11}=0 \quad \text{[equation 13]}$$

Now by summing up equations 2, 5, 8, and 11, the following expression is obtained:

$$(h_{0,0}+h_{3,0}+h_{6,0}+h_{0,9})d_0+(h_{0,1}+h_{3,1}+h_{6,1}+h_{9,1})d_1+\ldots+(h_{0,11}+h_{3,11}+h_{6,11}+h_{9,11})d_{11}+p_0+p_3+p_0+p_3+p_6+p_6+p_9+p_0+p_9=0$$

Since only $p_0$ appears an odd number of times in the equation above, all other parity check bits cancel except for $p_0$, and thus:

$$p_0=(h_{0,0}+h_{3,0}+h_{6,0}+h_{9,0})d_0+(h_{0,1}+h_{3,1}+h_{6,1}+h_{9,1})d_1+\ldots+(h_{0,11}+h_{3,11}+h_{6,11}+h_{9,11})d_{11}$$

Likewise:

$$p_1=(h_{1,0}+h_{4,0}+h_{7,0}+h_{10,0})d_0+(h_{1,1}+h_{4,1}+h_{7,1}+h_{10,1})d_1+\ldots+(h_{1,11}+h_{4,11}+h_{7,11}+h_{10,11})d_{11}$$

$$p_2=(h_{2,0}+h_{5,0}+h_{8,0}+h_{11,0})d_0+(h_{2,1}+h_{5,1}+h_{8,1}+h_{11,1})d_1+\ldots+(h_{2,11}+h_{5,11}+h_{8,11}+h_{11,11})d_{11}$$

After determining $p_0$, $p_1$, $p_2$ the other parity check bits are obtained recursively:

$$p_3=h_{0,0}d_0+h_{0,1}d_1+\ldots+h_{0,11}d_{11}+p_0$$

$$p_4=h_{1,0}d_0+h_{1,1}d_1+\ldots+h_{1,11}d_{11}+p_1$$

$$p_5=h_{2,0}d_0+h_{2,1}d_1+\ldots+h_{2,11}d_{11}+p_2$$

$$p_6=h_{3,0}d_0+h_{3,1}d_1+\ldots+h_{3,11}d_{11}+p_0+p_3$$

$$p_7=h_{4,0}d_0+h_{4,1}d_1+\ldots+h_{4,11}d_{11}+p_1+p_4$$

$$p_8=h_{5,0}d_0+h_{5,1}d_1+\ldots+h_{5,11}d_{11}+p_2+p_5$$

$$p_9=h_{6,0}d_0+h_{6,1}d_1+\ldots+h_{6,11}d_{11}+p_6$$

$$p_{10}=h_{7,0}d_0+h_{7,1}d_1+\ldots+h_{7,11}d_{11}+p_7$$

$$p_{11}=h_{8,0}d_0+h_{8,1}d_1+\ldots+h_{8,11}d_{11}+p_8 \quad \text{[equation 14]}$$

The present invention provides new LPDC base parity matrices, and expanded matrices based on the new base parity matrices, and method for use thereof.

The locations of non-zero matrices for rate R in a first exemplary matrix are chosen, so that:

a) parity part ((1−R)*24 rightmost columns) of the matrix is designed to allow simple encoding algorithms;

b) weights of all columns in the data portion of base parity check matrix is uniform;

c) weights of all rows in the data portion of a base parity check matrix is uniform;

d) the parity part of the matrix allows simple encoding algorithms. For example, the encoding algorithm based on equation 1, or equation 14.

An example of R=3/4 base parity check matrix design using criteria a) to d) is:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 1 0 0 0 0 0 0 1 1
0 1 1 1 1 0 0 0 1 1 1 1 1 1 0 0 1 1 1 0 0 0 0 1
```

The rate R=3/4 matrix definition built based on such base parity check matrix covers expansion factors in the range L between 24 and $L_{max}=96$ in increments of 4. Right circular shifts of the corresponding L×L identity matrix $s_{ij}$, are determined as follows:

$$s'_{ij} = \begin{cases} \text{floor}\left(\dfrac{L \times s_{ij}}{L_{max}}\right), & s_{ij} > 0 \\ s_{ij}, & \text{otherwise,} \end{cases}$$

where $s_{ij}$ is specified in the matrix definition below:

```
 6  38   3  93  -1  -1  -1  30  70  -1  86  -1  37  38   4  11  -1  46  48   0  -1  -1  -1  -
62  94  19  84  -1  92  78  -1  15  -1  -1  92  -1  45  24  32  30  -1  -1   0   0  -1  -1  -
71  -1  55  -1  12  66  45  79  -1  78  -1  -1  10  -1  22  55  70  82  -1  -1   0   0  -1  -
38  61  -1  66   9  73  47  64  -1  39  61  43  -1  -1  -1  -1  95  32   0  -1  -1   0   0  -
-1  -1  -1  -1  32  52  55  80  95  22   6  51  24  90  44  20  -1  -1  -1  -1  -1  -1   0  (
-1  63  31  88  20  -1  -1  -1   6  40  56  16  71  53  -1  -1  27  26  48  -1  -1  -1  -1  (
```

The locations of non-zero matrices for rate R in a second exemplary matrix are chosen, so that:

a) parity part ((1−R)*24 rightmost columns) of the matrix is designed to allow simple encoding algorithms;

b) minimum weight of the data portion of the matrix (R*24 leftmost columns) is 3;

c) maximum weight of the columns of the data portion is maximized, with a constraint of maximum total base parity check matrix weight; and d) row weight is uniform or close to uniform;

e) the parity part of the matrix uses simple encoding algorithms. For example, the encoding algorithm based on equation 1, or equation 14.

For example, the base parity check matrix weight may be selected to be 88. The remaining weight is then distributed in the data part of the matrix in such a way that the matrix becomes as irregular as possible.

An example of R=2/3 base parity check matrix design using criteria a) to e) with the constraint of maximum base parity check matrix weight being 88, is:

```
1 1 1 1 1 0 0 0 0 0 0 1 0 1 1 1 1 1 0 0 0 0 0 0
1 1 1 1 0 0 0 1 1 1 1 0 1 0 0 0 0 1 1 0 0 0 0 0
1 1 1 1 1 1 1 0 0 0 1 0 0 0 1 0 0 0 1 1 0 0 0 0
1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
1 1 1 1 1 1 0 1 0 0 0 1 0 0 0 1 0 0 0 0 0 0 1 1
1 1 1 1 1 0 0 1 1 1 0 0 0 0 0 1 1 0 0 0 0 0 0 1
```

Three matrices below expand the above base parity check matrix to achieve code lengths of 1944, 1296, and 648 bits using expansion factors L=81, 54, and 27, respectively.

Code Length=1944, Expansion Factor 81

```
61 75  4 63 56 -1 -1 -1 -1 -1 -1  8 -1  2 17 25  1  0 -1 -1 -1 -1 -1 -1
56 74 77 20 -1 -1 -1 64 24  4 67 -1  7 -1 -1 -1 -1  0  0 -1 -1 -1 -1 -1
28 21 68 10  7 14 65 -1 -1 -1 23 -1 -1 -1 75 -1 -1 -1  0  0 -1 -1 -1 -1
48 38 43 78 76 -1 -1 -1 -1  5 36 -1 15 72 -1 -1 -1 -1  0  0 -1 -1 -1
40  2 53 25 -1 52 62 -1 20 -1 -1 44 -1 -1 -1 -1  0 -1 -1 -1  0  0 -1 -1
69 23 64 10 22 -1 21 -1 -1 -1 -1 -1 68 23 29 -1 -1 -1 -1 -1 -1  0  0 -1
12  0 68 20 55 61 -1 40 -1 -1 -1 52 -1 -1 -1 44 -1 -1 -1 -1 -1 -1  0  0
58  8 34 64 78 -1 -1 11 78 24 -1 -1 -1 -1 -1 58  1 -1 -1 -1 -1 -1 -1  0
```

Code Length=1296, Expansion Factor 54

```
49 13 11 30 27 -1 -1 -1 -1 -1 -1 34 -1 46  0 45  1  0 -1 -1 -1 -1 -1 -1
38 32 35 53 -1 -1 -1 14 40 12  7 -1 42 -1 -1 -1 -1  0  0 -1 -1 -1 -1 -1
13 52 19 51 42 23 49 -1 -1 -1 20 -1 -1 -1  3 -1 -1 -1  0  0 -1 -1 -1 -1
43 22 23 48  7 -1 -1 -1 -1 38 28 -1 46 17 -1 -1 -1 -1  0  0 -1 -1 -1
41 25 44 17 -1 11 46 -1 27 -1 -1 12 -1 -1 -1 -1  0 -1 -1 -1  0  0 -1 -1
12 27 32  9 13 -1 41 -1 -1 -1 -1 -1 49 31 23 -1 -1 -1 -1 -1 -1  0  0 -1
 8 34 23 35 23 52 -1 36 -1 -1 -1 43 -1 -1 -1  5 -1 -1 -1 -1 -1 -1  0  0
17 19 48 16 11 -1 -1 38 43 11 -1 -1 -1 -1 -1  8  1 -1 -1 -1 -1 -1 -1  0
```

Code Length=648, Expansion Factor 27

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
24 21 15  5  8 -1 -1 -1 -1 19 15 -1 17  3 -1 -1 -1 -1 -1  0  0 -1 -1 -1
15 18  7 25 -1  7  6 -1  8 -1 -1  4 -1 -1 -1 -1  0 -1 -1 -1  0  0 -1 -1
 1 24 23 12 23 -1  1 -1 -1 -1 -1 -1  0  0 12 -1 -1 -1 -1 -1 -1  0  0 -1
13  4 12 17 22 23 -1  4 -1 -1 -1  6 -1 -1 -1  9 -1 -1 -1 -1 -1 -1  0  0
14 25 26  3  5 -1 -1  8  2  7 -1 -1 -1 -1 -1  7  1 -1 -1 -1 -1 -1 -1  0
```

What is claimed is:

1. A method of decoding low-density parity-check (LDPC) encoded data, comprising:

applying the following expanded parity check matrix to generate decoded data:

```
61 75  4 63 56 -1 -1 -1 -1 -1 -1  8 -1  2 17
56 74 77 20 -1 -1 -1 64 24  4 67 -1  7 -1 -1
28 21 68 10  7 14 65 -1 -1 -1 23 -1 -1 -1 75
48 38 43 78 76 -1 -1 -1 -1  5 36 -1 15 72 -1
40  2 53 25 -1 52 62 -1 20 -1 -1 44 -1 -1 -1
69 23 64 10 22 -1 21 -1 -1 -1 -1 -1 68 23 29
12  0 68 20 55 61 -1 40 -1 -1 -1 52 -1 -1 -1
58  8 34 64 78 -1 -1 11 78 24 -1 -1 -1 -1 -1
```

-continued
```
25  1  0 -1 -1 -1 -1 -1 -1
-1 -1  0  0 -1 -1 -1 -1 -1
-1 -1 -1  0  0 -1 -1 -1 -1
-1 -1 -1 -1  0  0 -1 -1 -1
-1  0 -1 -1 -1  0  0 -1 -1
-1 -1 -1 -1 -1 -1  0  0 -1
44 -1 -1 -1 -1 -1 -1  0  0
58  1 -1 -1 -1 -1 -1 -1  0
``` wherein −1 represents an 81×81 all-zero square matrix, and any other integer, $S_{ij}$, represents an 81×81 identity matrix circularly right shifted by a shift amount equal to $S_{ij}$.

2. A method as defined in claim 1, wherein applying the expanded parity check matrix comprises applying the expanded parity check matrix to 1296 input bits, the decoded data comprising 648 parity bits.

3. An apparatus for encoding data using low-density parity-check (LDPC), comprising:

circuitry operable to apply the following expanded parity check matrix to generate encoded data:

```
61 75  4 63 56 -1 -1 -1 -1 -1 -1  8 -1  2 17 25  1  0 -1 -1 -1 -1 -1 -1
56 74 77 20 -1 -1 -1 64 24  4 67 -1  7 -1 -1 -1 -1  0  0 -1 -1 -1 -1 -1
28 21 68 10  7 14 65 -1 -1 -1 23 -1 -1 -1 75 -1 -1 -1  0  0 -1 -1 -1 -1
48 38 43 78 76 -1 -1 -1 -1  5 36 -1 15 72 -1 -1 -1 -1 -1  0  0 -1 -1 -1
40  2 53 25 -1 52 62 -1 20 -1 -1 44 -1 -1 -1  0 -1 -1 -1  0  0 -1 -1 -1
69 23 64 10 22 -1 21 -1 -1 -1 -1 68 23 29 -1 -1 -1 -1 -1 -1  0  0 -1
12  0 68 20 55 61 -1 40 -1 -1 -1 52 -1 -1 -1 44 -1 -1 -1 -1 -1 -1  0  0
58  8 34 64 78 -1 -1 11 78 24 -1 -1 -1 -1 -1 58  1 -1 -1 -1 -1 -1 -1  0
``` wherein −1 represents an 81×81 all-zero square matrix, and any other integer, $S_{i,j}$, represents an 81×81 identity matrix circularly right shifted by a shift amount equal to $S_{ij}$.

4. The apparatus as defined in claim 3, wherein the circuitry is to apply the expanded parity check matrix to 1296 input bits, the encoded data comprising 648 parity bits.

5. An apparatus for encoding data using low-density parity-check (LDPC), comprising:

a matrix application element operable to apply the following expanded parity check matrix to generate encoded data:

| | | | | | | | | | | | | | | | | | | | | | |
|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |
| 12 | 0 | 68 | 20 | 55 | 61 | −1 | 40 | −1 | −1 | −1 | 52 | −1 | −1 | −1 | 44 | −1 | −1 | −1 | −1 | −1 | −1 | 0 | 0 |
| 58 | 8 | 34 | 64 | 78 | −1 | −1 | 11 | 78 | 24 | −1 | −1 | −1 | −1 | −1 | 58 | 1 | −1 | −1 | −1 | −1 | −1 | −1 | 0 | wherein −1 represents an 81×81 all-zero square matrix, and any other integer, $S_{ij}$, represents an 81×81 identity matrix circularly right shifted by a shift amount equal to $S_{ij}$.

6. The apparatus as defined in claim 5, wherein the matrix application element is to apply the expanded parity check matrix to 1296 input bits, the encoded data comprising 648 parity bits.

7. An apparatus for decoding low-density parity-check (LDPC) encoded data, comprising:

circuitry operable to apply the following expanded parity check matrix to generate decoded data:

| | | | | | | | | | | | | | | | | | | | | | |
|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |
| 12 | 0 | 68 | 20 | 55 | 61 | −1 | 40 | −1 | −1 | −1 | 52 | −1 | −1 | −1 | 44 | −1 | −1 | −1 | −1 | −1 | −1 | 0 | 0 |
| 58 | 8 | 34 | 64 | 78 | −1 | −1 | 11 | 78 | 24 | −1 | −1 | −1 | −1 | −1 | 58 | 1 | −1 | −1 | −1 | −1 | −1 | −1 | 0 | wherein −1 represents an 81×81 all-zero square matrix, and any other integer, $S_{ij}$, represents an 81×81 identity matrix circularly right shifted by a shift amount equal to $S_{ij}$.

8. The apparatus as defined in claim 7, wherein the circuitry is to apply the expanded parity check matrix to 1296 input bits, the decoded data comprising 648 parity bits.

9. An apparatus for decoding low-density parity-check (LDPC) encoded data, comprising:

a matrix application element operable to apply the following expanded parity check matrix to generate decoded data:

| | | | | | | | | | | | | | | | | | | | | | |
|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |

-continued

| | | | | | | | | | | | | | | | | | | | | | | | |
|---|---|---|---|---|---|---|---|---|---|---|---|---|---|---|---|---|---|---|---|---|---|---|---|
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |
| 12 | 0 | 68 | 20 | 55 | 61 | −1 | 40 | −1 | −1 | −1 | 52 | −1 | −1 | −1 | 44 | −1 | −1 | −1 | −1 | −1 | −1 | 0 | 0 |
| 58 | 8 | 34 | 64 | 78 | −1 | −1 | 11 | 78 | 24 | −1 | −1 | −1 | −1 | −1 | 58 | 1 | −1 | −1 | −1 | −1 | −1 | −1 | 0 | wherein −1 represents an 81×81 all-zero square matrix, and any other integer, $S_{ij}$, represents an 81×81 identity matrix circularly right shifted by a shift amount equal to $S_{ij}$.

10. The apparatus as defined in claim 9, wherein the matrix application element is to apply the expanded parity check matrix to 1296 input bits, the decoded data comprising 648 parity bits.

11. A telecommunications network, comprising:
a low-density parity-check (LDPC) encoder operable to apply the following expanded parity check matrix to generate encoded data:

| | | | | | | | | | | | | | | | | | | | | | | | |
|---|---|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |
| 12 | 0 | 68 | 20 | 55 | 61 | −1 | 40 | −1 | −1 | −1 | 52 | −1 | −1 | −1 | 44 | −1 | −1 | −1 | −1 | −1 | −1 | 0 | 0 |
| 58 | 8 | 34 | 64 | 78 | −1 | −1 | 11 | 78 | 24 | −1 | −1 | −1 | −1 | −1 | 58 | 1 | −1 | −1 | −1 | −1 | −1 | −1 | 0 | wherein −1 represents an 81×81 all-zero square matrix, and any other integer, $S_{ij}$, represents an 81×81 identity matrix circularly right shifted by a shift amount equal to $S_{ij}$; and
an LDPC decoder operable to apply the expanded parity check matrix to recover input data.

12. A telecommunications network as defined in claim 11, wherein the LDPC encoder is to apply the expanded parity check matrix to 1296 input bits, the encoded data comprising 648 parity bits.

13. A method of operating a telecommunications network, comprising:
applying the following expanded parity check matrix to generate encoded data:

| | | | | | | | | | | | | | | | | | | | | | | | |
|---|---|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |
| 12 | 0 | 68 | 20 | 55 | 61 | −1 | 40 | −1 | −1 | −1 | 52 | −1 | −1 | −1 | 44 | −1 | −1 | −1 | −1 | −1 | −1 | 0 | 0 |
| 58 | 8 | 34 | 64 | 78 | −1 | −1 | 11 | 78 | 24 | −1 | −1 | −1 | −1 | −1 | 58 | 1 | −1 | −1 | −1 | −1 | −1 | −1 | 0 | wherein −1 represents an 81×81 all-zero square matrix, and any other integer, $S_{ij}$, represents an 81×81 identity matrix circularly right shifted by a shift amount equal to $S_{ij}$; and applying the expanded parity check matrix to recover input data.

14. A method as defined in claim 13, wherein applying the expanded parity check matrix comprises applying the expanded parity check matrix to 1296 input bits, the encoded data comprising 648 parity bits.

15. A transceiver, comprising:

a low-density parity-check (LDPC) encoder operable to apply the following expanded parity check matrix to generate encoded data:

| 61 | 75 | 4  | 63 | 56 | −1 | −1 | −1 | −1 | −1 | −1 | 8  | −1 | 2  | 17 | 25 | 1  | 0  | −1 | −1 | −1 | −1 | −1 | −1 |
|----|----|----|----|----|----|----|----|----|----|----|----|----|----|----|----|----|----|----|----|----|----|----|----|
| 56 | 74 | 77 | 20 | −1 | −1 | −1 | 64 | 24 | 4  | 67 | −1 | 7  | −1 | −1 | −1 | −1 | 0  | 0  | −1 | −1 | −1 | −1 | −1 |
| 28 | 21 | 68 | 10 | 7  | 14 | 65 | −1 | −1 | −1 | 23 | −1 | −1 | −1 | 75 | −1 | −1 | −1 | 0  | 0  | −1 | −1 | −1 | −1 |
| 48 | 38 | 43 | 78 | 76 | −1 | −1 | −1 | −1 | 5  | 36 | −1 | 15 | 72 | −1 | −1 | −1 | −1 | −1 | 0  | 0  | −1 | −1 | −1 |
| 40 | 2  | 53 | 25 | −1 | 52 | 62 | −1 | 20 | −1 | −1 | 44 | −1 | −1 | −1 | −1 | 0  | −1 | −1 | −1 | 0  | 0  | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0  | 0  | −1 |
| 12 | 0  | 68 | 20 | 55 | 61 | −1 | 40 | −1 | −1 | −1 | 52 | −1 | −1 | −1 | 44 | −1 | −1 | −1 | −1 | −1 | −1 | 0  | 0  |
| 58 | 8  | 34 | 64 | 78 | −1 | −1 | 11 | 78 | 24 | −1 | −1 | −1 | −1 | −1 | 58 | 1  | −1 | −1 | −1 | −1 | −1 | −1 | 0  | wherein −1 represents an 81×81 all-zero square matrix, and any other integer, $S_{ij}$, represents an 81×81 identity matrix circularly right shifted by a shift amount equal to $S_{ij}$; and an LDPC decoder operable to apply the expanded parity check matrix to generate decoded data.

16. A transceiver as defined in claim 15, wherein the LDPC encoder is to apply the expanded parity check matrix to 1296 input bits, the encoded data comprising 648 parity bits.

17. A method of operating a transceiver, comprising:

applying the following expanded parity check matrix to generate encoded data:

| 61 | 75 | 4  | 63 | 56 | −1 | −1 | −1 | −1 | −1 | −1 | 8  | −1 | 2  | 17 | 25 | 1  | 0  | −1 | −1 | −1 | −1 | −1 | −1 |
|----|----|----|----|----|----|----|----|----|----|----|----|----|----|----|----|----|----|----|----|----|----|----|----|
| 56 | 74 | 77 | 20 | −1 | −1 | −1 | 64 | 24 | 4  | 67 | −1 | 7  | −1 | −1 | −1 | −1 | 0  | 0  | −1 | −1 | −1 | −1 | −1 |
| 28 | 21 | 68 | 10 | 7  | 14 | 65 | −1 | −1 | −1 | 23 | −1 | −1 | −1 | 75 | −1 | −1 | −1 | 0  | 0  | −1 | −1 | −1 | −1 |
| 48 | 38 | 43 | 78 | 76 | −1 | −1 | −1 | −1 | 5  | 36 | −1 | 15 | 72 | −1 | −1 | −1 | −1 | −1 | 0  | 0  | −1 | −1 | −1 |
| 40 | 2  | 53 | 25 | −1 | 52 | 62 | −1 | 20 | −1 | −1 | 44 | −1 | −1 | −1 | −1 | 0  | −1 | −1 | −1 | 0  | 0  | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0  | 0  | −1 |
| 12 | 0  | 68 | 20 | 55 | 61 | −1 | 40 | −1 | −1 | −1 | 52 | −1 | −1 | −1 | 44 | −1 | −1 | −1 | −1 | −1 | −1 | 0  | 0  |
| 58 | 8  | 34 | 64 | 78 | −1 | −1 | 11 | 78 | 24 | −1 | −1 | −1 | −1 | −1 | 58 | 1  | −1 | −1 | −1 | −1 | −1 | −1 | 0  | wherein −1 represents an 81×81 all-zero square matrix, and any other integer, $S_{ij}$, represents an 81×81 identity matrix circularly right shifted by a shift amount equal to $S_{ij}$; and applying the expanded parity check matrix to generate decoded data.

18. A method as defined in claim 17, wherein applying the expanded parity check matrix comprises applying the expanded parity check matrix to 1296 input bits, the encoded data comprising 648 parity bits.

19. A method of decoding low-density parity-check (LDPC) encoded data, comprising:

decoding the LDPC encoded data using an expanded parity check matrix:

| | | | | | | | | | | | | | | | | | | | | | |
|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |
| 12 | 0 | 68 | 20 | 55 | 61 | −1 | 40 | −1 | −1 | −1 | 52 | −1 | −1 | −1 | 44 | −1 | −1 | −1 | −1 | −1 | −1 | 0 | 0 |
| 58 | 8 | 34 | 64 | 78 | −1 | −1 | 11 | 78 | 24 | −1 | −1 | −1 | −1 | −1 | 58 | 1 | −1 | −1 | −1 | −1 | −1 | −1 | 0 | wherein −1 represents an 81×81 all-zero square matrix, and any other integer, $S_{ij}$, represents an 81×81 identity matrix circularly right shifted by a shift amount equal to $S_{ij}$.

20. The method as defined in claim 19, wherein using the expanded parity check matrix comprises applying the expanded parity check matrix to 1296 input bits.

21. An apparatus for decoding low-density parity-check (LDPC) encoded data, comprising:

circuitry configured to decode the LDPC encoded data using the following expanded parity check matrix:

| | | | | | | | | | | | | | | | | | | | | | |
|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |
| 12 | 0 | 68 | 20 | 55 | 61 | −1 | 40 | −1 | −1 | −1 | 52 | −1 | −1 | −1 | 44 | −1 | −1 | −1 | −1 | −1 | −1 | 0 | 0 |
| 58 | 8 | 34 | 64 | 78 | −1 | −1 | 11 | 78 | 24 | −1 | −1 | −1 | −1 | −1 | 58 | 1 | −1 | −1 | −1 | −1 | −1 | −1 | 0 | wherein −1 represents an 81×81 all-zero square matrix, and any other integer, $S_{ij}$, represents an 81×81 identity matrix circularly right shifted by a shift amount equal to $S_{ij}$.

22. The apparatus as defined in claim 21, wherein the circuitry is further configured to apply the expanded parity check matrix to 1296 input bits.

23. An apparatus for encoding data using low-density parity-check (LDPC), comprising:

circuitry configured to encode the data using the following expanded parity check matrix:

| | | | | | | | | | | | | | | | | | | | | | |
|---|---|---|---|---|---|---|---|---|---|---|---|---|---|---|---|---|---|---|---|---|---|
| 61 | 75 | 4 | 63 | 56 | −1 | −1 | −1 | −1 | −1 | −1 | 8 | −1 | 2 | 17 | 25 | 1 | 0 | −1 | −1 | −1 | −1 | −1 | −1 |
| 56 | 74 | 77 | 20 | −1 | −1 | −1 | 64 | 24 | 4 | 67 | −1 | 7 | −1 | −1 | −1 | −1 | 0 | 0 | −1 | −1 | −1 | −1 | −1 |
| 28 | 21 | 68 | 10 | 7 | 14 | 65 | −1 | −1 | −1 | 23 | −1 | −1 | −1 | 75 | −1 | −1 | −1 | 0 | 0 | −1 | −1 | −1 | −1 |
| 48 | 38 | 43 | 78 | 76 | −1 | −1 | −1 | −1 | 5 | 36 | −1 | 15 | 72 | −1 | −1 | −1 | −1 | 0 | 0 | −1 | −1 | −1 |
| 40 | 2 | 53 | 25 | −1 | 52 | 62 | −1 | 20 | −1 | −1 | 44 | −1 | −1 | −1 | −1 | 0 | −1 | −1 | −1 | 0 | 0 | −1 | −1 |
| 69 | 23 | 64 | 10 | 22 | −1 | 21 | −1 | −1 | −1 | −1 | −1 | 68 | 23 | 29 | −1 | −1 | −1 | −1 | −1 | −1 | 0 | 0 | −1 |

-continued

```
12  0 68 20 55 61 -1 40 -1 -1 -1 52 -1 -1 -1 44 -1 -1 -1 -1 -1  0  0
58  8 34 64 78 -1 -1 11 78 24 -1 -1 -1 -1 -1 58  1 -1 -1 -1 -1 -1  0
``` wherein −1 represents an 81×81 all-zero square matrix, and any other integer, $S_{ij}$, represents an 81×81 identity matrix circularly right shifted by a shift amount equal to $S_{ij}$.

24. The apparatus as defined in claim 23, wherein the circuitry is further configured to apply the expanded parity check matrix to 1296 input bits.

25. A method of encoding data using low-density parity-check (LDPC), comprising:

encoding the data using the following expanded parity check matrix:

```
61 75  4 63 56 -1 -1 -1 -1 -1 -1  8 -1  2 17 25  1  0 -1 -1 -1 -1 -1 -1
56 74 77 20 -1 -1 -1 64 24  4 67 -1  7 -1 -1 -1 -1  0  0 -1 -1 -1 -1 -1
28 21 68 10  7 14 65 -1 -1 -1 23 -1 -1 -1 75 -1 -1 -1  0  0 -1 -1 -1 -1
48 38 43 78 76 -1 -1 -1 -1  5 36 -1 15 72 -1 -1 -1 -1 -1  0  0 -1 -1 -1
40  2 53 25 -1 52 62 -1 20 -1 -1 44 -1 -1 -1 -1  0 -1 -1 -1  0  0 -1 -1
69 23 64 10 22 -1 21 -1 -1 -1 -1 -1 68 23 29 -1 -1 -1 -1 -1 -1  0  0 -1
12  0 68 20 55 61 -1 40 -1 -1 -1 52 -1 -1 -1 44 -1 -1 -1 -1 -1 -1  0  0
58  8 34 64 78 -1 -1 11 78 24 -1 -1 -1 -1 -1 58  1 -1 -1 -1 -1 -1 -1  0
``` wherein −1 represents an 81×81 all-zero square matrix, and any other integer, $S_{ij}$, represents an 81×81 identity matrix circularly right shifted by a shift amount equal to $S_{ij}$.

26. The method as defined in claim 25, wherein using the expanded parity check matrix comprises applying the expanded parity check matrix to 1296 input bits.

27. An apparatus for encoding data using low-density parity-check (LDPC), comprising:

a matrix application element configured to encode the data using the following expanded parity check matrix:

```
61 75  4 63 56 -1 -1 -1 -1 -1 -1  8 -1  2 17 25  1  0 -1 -1 -1 -1 -1 -1
56 74 77 20 -1 -1 -1 64 24  4 67 -1  7 -1 -1 -1 -1  0  0 -1 -1 -1 -1 -1
28 21 68 10  7 14 65 -1 -1 -1 23 -1 -1 -1 75 -1 -1 -1  0  0 -1 -1 -1 -1
48 38 43 78 76 -1 -1 -1 -1  5 36 -1 15 72 -1 -1 -1 -1 -1  0  0 -1 -1 -1
40  2 53 25 -1 52 62 -1 20 -1 -1 44 -1 -1 -1 -1  0 -1 -1 -1  0  0 -1 -1
69 23 64 10 22 -1 21 -1 -1 -1 -1 -1 68 23 29 -1 -1 -1 -1 -1 -1  0  0 -1
12  0 68 20 55 61 -1 40 -1 -1 -1 52 -1 -1 -1 44 -1 -1 -1 -1 -1 -1  0  0
58  8 34 64 78 -1 -1 11 78 24 -1 -1 -1 -1 -1 58  1 -1 -1 -1 -1 -1 -1  0
``` wherein −1 represents an 81×81 all-zero square matrix, and any other integer, $S_{ij}$, represents an 81×81 identity matrix circularly right shifted by a shift amount equal to $S_{ij}$.

28. The apparatus as defined in claim 27, wherein the matrix application element is further configured to apply the expanded parity check matrix to 1296 input bits.

29. An apparatus for decoding low-density parity-check (LDPC) encoded data, comprising:

a matrix application element configured to decode the LDPC encoded data using the following expanded parity check matrix:

```
61  75  4   63  56  -1  -1  -1  -1  -1  -1  8   -1  2   17  25  1   0   -1  -1  -1  -1  -1  -1
56  74  77  20  -1  -1  -1  64  24  4   67  -1  7   -1  -1  -1  -1  0   0   -1  -1  -1  -1  -1
28  21  68  10  7   14  65  -1  -1  -1  23  -1  -1  -1  75  -1  -1  -1  0   0   -1  -1  -1  -1
48  38  43  78  76  -1  -1  -1  -1  5   36  -1  15  72  -1  -1  -1  -1  0   0   -1  -1  -1  -1
40  2   53  25  -1  52  62  -1  20  -1  -1  44  -1  -1  -1  -1  0   -1  -1  -1  0   0   -1  -1
69  23  64  10  22  -1  21  -1  -1  -1  -1  -1  68  23  29  -1  -1  -1  -1  -1  -1  0   0   -1
12  0   68  20  55  61  -1  40  -1  -1  -1  52  -1  -1  -1  44  -1  -1  -1  -1  -1  -1  0   0
58  8   34  64  78  -1  -1  11  78  24  -1  -1  -1  -1  -1  58  1   -1  -1  -1  -1  -1  -1  0
``` wherein −1 represents an 81×81 all-zero square matrix, and any other integer, $S_{ij}$, represents an 81×81 identity matrix circularly right shifted by a shift amount equal to $S_{ij}$.

30. The apparatus as defined in claim 29, wherein the matrix application element is further configured to apply the expanded parity check matrix to 1296 input bits.

31. A device comprising:

a low-density parity-check (LDPC) encoder configured to:

encode data using the following expanded parity check matrix:

```
61  75  4   63  56  -1  -1  -1  -1  -1  -1  8   -1  2   17  25  1   0   -1  -1  -1  -1  -1  -1
56  74  77  20  -1  -1  -1  64  24  4   67  -1  7   -1  -1  -1  -1  0   0   -1  -1  -1  -1  -1
28  21  68  10  7   14  65  -1  -1  -1  23  -1  -1  -1  75  -1  -1  -1  0   0   -1  -1  -1  -1
48  38  43  78  76  -1  -1  -1  -1  5   36  -1  15  72  -1  -1  -1  -1  0   0   -1  -1  -1  -1
40  2   53  25  -1  52  62  -1  20  -1  -1  44  -1  -1  -1  -1  0   -1  -1  -1  0   0   -1  -1
69  23  64  10  22  -1  21  -1  -1  -1  -1  -1  68  23  29  -1  -1  -1  -1  -1  -1  0   0   -1
12  0   68  20  55  61  -1  40  -1  -1  -1  52  -1  -1  -1  44  -1  -1  -1  -1  -1  -1  0   0
58  8   34  64  78  -1  -1  11  78  24  -1  -1  -1  -1  -1  58  1   -1  -1  -1  -1  -1  -1  0
``` wherein −1 represents an 81×81 all-zero square matrix, and any other integer, $S_{ij}$, represents an 81×81 identity matrix circularly right shifted by a shift amount equal to $S_{ij}$.

32. A device comprising:

a low-density parity-check (LDPC) decoder configured to:

decode encoded data using an expanded parity check matrix:

```
61  75  4   63  56  -1  -1  -1  -1  -1  -1  8   -1  2   17  25  1   0   -1  -1  -1  -1  -1  -1
56  74  77  20  -1  -1  -1  64  24  4   67  -1  7   -1  -1  -1  -1  0   0   -1  -1  -1  -1  -1
28  21  68  10  7   14  65  -1  -1  -1  23  -1  -1  -1  75  -1  -1  -1  0   0   -1  -1  -1  -1
48  38  43  78  76  -1  -1  -1  -1  5   36  -1  15  72  -1  -1  -1  -1  0   0   -1  -1  -1  -1
40  2   53  25  -1  52  62  -1  20  -1  -1  44  -1  -1  -1  -1  0   -1  -1  -1  0   0   -1  -1
69  23  64  10  22  -1  21  -1  -1  -1  -1  -1  68  23  29  -1  -1  -1  -1  -1  -1  0   0   -1
12  0   68  20  55  61  -1  40  -1  -1  -1  52  -1  -1  -1  44  -1  -1  -1  -1  -1  -1  0   0
58  8   34  64  78  -1  -1  11  78  24  -1  -1  -1  -1  -1  58  1   -1  -1  -1  -1  -1  -1  0
``` wherein −1 represents an 81×81 all-zero square matrix, and any other integer, $S_{ij}$, represents an 81×81 identity matrix circularly right shifted by a shift amount equal to $S_{ij}$.

* * * * *